(12) United States Patent
Han et al.

(10) Patent No.: US 6,225,199 B1
(45) Date of Patent: May 1, 2001

(54) SEMICONDUCTOR DEVICE HAVING TRIPLE-WELL

(75) Inventors: Jae-Jong Han, Seoul; Doo-Hyun Hwang; Byung-Kee Kim, both of Yongin; Beung-Keun Lee, Kyungki-do, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/348,381

(22) Filed: Jul. 7, 1999

(30) Foreign Application Priority Data

Jul. 7, 1998 (KR) .................................. 98-27298

(51) Int. Cl.⁷ .................................. H01L 21/265
(52) U.S. Cl. ............................ 438/525; 438/526
(58) Field of Search .................. 438/514, 525, 438/526, 527, 224, 228

(56) References Cited

U.S. PATENT DOCUMENTS

| | | | |
|---|---|---|---|
| 5,512,498 | * 4/1996 | Okamoto | 438/228 |
| 5,624,858 | * 4/1997 | Terashima | 438/520 |
| 5,698,458 | * 12/1997 | Hsue et al. | 438/527 |
| 5,814,866 | * 9/1998 | Borland | 438/526 |
| 5,880,014 | * 3/1999 | Park et al. | 438/526 |
| 5,972,745 | * 10/1999 | Kalter et al. | 438/525 |
| 5,981,327 | * 11/1999 | Kim | 438/228 |
| 6,008,094 | * 12/1999 | Krivokapic et al. | 438/525 |
| 6,010,926 | * 1/2000 | Rho et al. | 438/526 |
| 6,040,208 | * 3/2000 | Honeycutt et al. | 438/525 |
| 6,066,522 | * 5/2000 | Hirase | 438/228 |
| 6,066,523 | * 5/2000 | Shim et al. | 438/228 |

\* cited by examiner

*Primary Examiner*—Savitri Mulpuri
(74) *Attorney, Agent, or Firm*—Cantor Colburn LLP

(57) ABSTRACT

The triple-well according to the present invention reduces a photo process forming a well isolation region which is used in a method for forming a prior well. That is, two times of photo processes are reduced to be one time, thereby simplifying a method for forming a triple-well of the DRAM device and reducing time and expenditure.

3 Claims, 6 Drawing Sheets

SEMICONDUCTOR DEVICE HAVING TRIPLE-WELL

FIELD OF THE INVENTION

The present invention relates to a method for fabricating a semiconductor device, and more particularly to a method for forming a triple well of a DRAM (dynamic random access memory) device.

BACKGROUND OF THE INVENTION

In order to improve circuit operation speed, insulate cell-to-cell, and prevent latch-up in a DRAM (dynamic random access memory) device, back bias voltage is generally applied to a bulk region of an NMOS transistor. Since the back bias voltage is then applied to a cell, a core, and a peripheral region of the DRAM device, current may be applied to a back bias voltage generator during forward current operation. Further, the applied current may damage the back bias voltage generator.

Thus, a triple-well structure adding a prior double-well structure to a second conductive first well isolation region 14 is suggested. Although a first back bias is applied to a peripheral region and a second back bias is applied to a cell or a core region in the triple-well structure, applying current to a back bias voltage generator is suppressed by the second conductive first well isolation region 14 formed under a first conductive first well 16 (for example, a P-type first well 16). As a result, the back bias voltage generator is not damaged. The first well isolation region 14 should secure overlap margin with respect to the P-type first well 16 over the first well isolation region 14. This aims at reliable suppression of applying current generated in an edge portion to the back bias voltage generator.

FIG. 1A to FIG. 1D sequentially illustrate a method for forming a prior triple-well.

Next, referring to FIG. 1A, a first photoresist film is formed on a first conductive (that is, P-type conductive) substrate 10 and then the first photoresist film is etched through a conventional photo-etching process defining the first well isolation region 14, so that a first photoresist pattern 12a is formed. The first well isolation region 14 is defined, in view of overlap margin with respect to the first well 16 (referring to FIG. 1B) formed over the first well isolation region 14 in a following process. In case the first photoresist pattern 12a is used as a mask and the tilt angle of the semiconductor substrate 10 is below 10 degrees, N-type impurity ion is implanted to form the first well isolation region 14.

Referring to FIG. 1B, the first photoresist pattern 12a is removed. Thereafter, a second photoresist film is formed through the foregoing method of defining the first well 16 and is patterned by a photo-etching process, so that a second photoresist pattern 12b is formed. Then, the second photoresist pattern 12b is used as a mask and P-type impurity ion is implanted into the semiconductor substrate 10, so that the first well 16 is formed over the first well isolation region 14. The first well 16 is formed in a cell array region of a DRAM device. In the first well 16 where an N-channel MOS transistor is formed, a sense amplifier, a word line driver, and an input/output gate are formed.

Referring to FIG. 1C, the second photoresist pattern 12b is removed. Thereafter, a third photoresist pattern 12c is formed through the foregoing method of defining a second well 18. The third photoresist pattern 12c is used as a mask and P-type impurity ion is implanted, so that the second well 18 is formed. The second well 18 is formed in a peripheral circuit region of the DRAM device. An N-channel MOS transistor is formed in the second well 18.

Referring to FIG. 1D, the third photoresist is removed. Thereafter, a fourth photoresist pattern 12d is formed through the foregoing method of defining a third well 20. The fourth photoresist pattern 12d is used as a mask and N-type impurity ion is implanted, so that the third well 20 is formed. The third well 20 is formed in a peripheral circuit region of the DRAM device. A P-channel MOS transistor is formed in the third well 20.

Since four photoresist patterns respectively define four regions, four-type-photo processes are essentially needed in the prior method.

SUMMARY OF THE INVENTION

It is a key object to provide a method for forming a triple-well capable of simplifying the formation processes and reducing time and expenditure by excluding a photo process of forming a first well isolation region in the method for forming a prior triple-well.

According to the present invention, the method includes forming a first mask on a first conductive semiconductor substrate for defining a first well region. A second conductive impurity ion is implanted into the semiconductor substrate by using the first mask with a large tilt angle ion implanting technique. Whenever the semiconductor substrate reaches a position having a predetermined orient angle during circulation thereof with a degree of 360 and less, impurity ion is implanted thereinto so that a first well isolation area is formed. A first conductive impurity ion is implanted by using the first mask again, so that the first well is formed so as to be overlaid on a portion of the first well isolation region in the semiconductor substrate. The first conductive impurity ion is implanted by using a second mask defining a second well region, to form a second well being away from the first well. A second conductive impurity ion is implanted into the semiconductor substrate in both sides of the first well and the second well by using a third mask defining the third well, so that a third well is formed to surround both sidewalls of the first well.

A first mask defining a first well region is formed on a first conductive substrate. Whenever the first mask reaches a position having predetermined orient angle while circulating 360 degrees, a second conductive impurity ion is implanted into the semiconductor substrate through the large tilt angle ion implanting technique using the first mask, so that a first well isolation region is formed. A first conductive impurity ion is implanted by using the first mask again, the first well is formed to be overlaid on a partial portion of the first well isolation region. The formation of the first well isolation region and the first well of the present invention with a photoresist film pattern excludes a photo process, thereby simplifying the process and reducing time and expenditure thereof.

BRIEF DESCRIPTION OF THE DRAWINGS

The present invention will be more apparently understood by describing a preferred embodiment in detail with reference to the attached drawings, in which.

DETAILED DESCRIPTION OF THE INVENTION

Now, the preferred embodiment of the present invention will be described with reference to the accompanying drawings.

FIGS. 3A–3D illustrate a method for forming a novel triple-well according to the present invention.

Figure 3A:
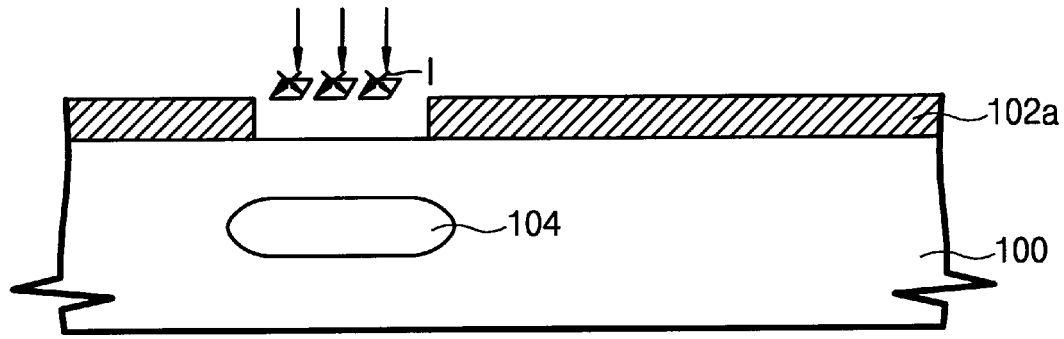
FIGS. 3A–3D are flow diagrams showing a method for forming a novel triple-well according to the present invention.
Figure 3B:
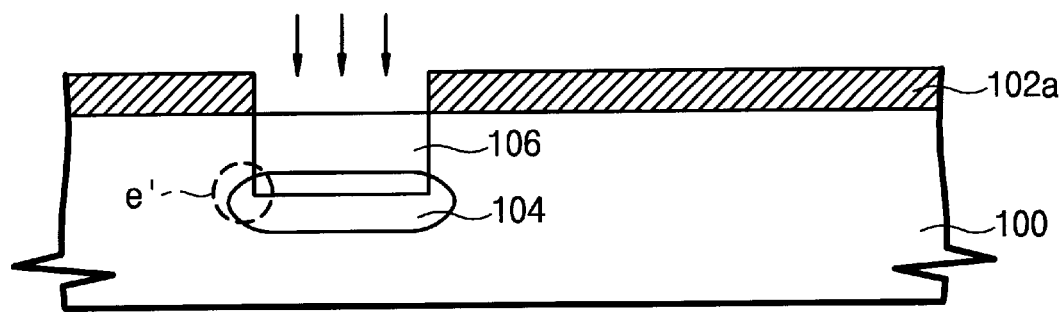

Referring to FIG. 3A, a first photoresist film is formed on a first conductive (for example, P-type) semiconductor substrate 100. The first photoresist film is patterned through a conventional etching process defining a first well, so that a first photoresist patten 102a is formed. The first photoresist pattern 102a is a square-type in which two sides opposite a plate zone of a wafer are parallel and other two sides are vertical. As follows, a photoresist pattern formed with the definition of wells is formed by setting a standard for the plate zone of the wafer in the foregoing way. The first photoresist pattern 102a is used as a mask, so that an impurity ion implanting process is performed to form a second conductive first well isolation region 104.

The ion implanting process forming the first well isolation region 104 is performed through a large tilt angle ion implanting process. This ion implanting technique is applied by the following conditions. The ion implanting direction is one selected having a tilt angle range of about 15 to 30 degrees with respect to the semiconductor substrate 100. That is, it is a large tilt angle. If the ion implanting process is performed with a tilt angle of below 10 degrees, overlap margin is not secured on an edge portion. As a result, a back bias voltage generator may be damaged by leakage current via the edge portion.

Figure 1A:
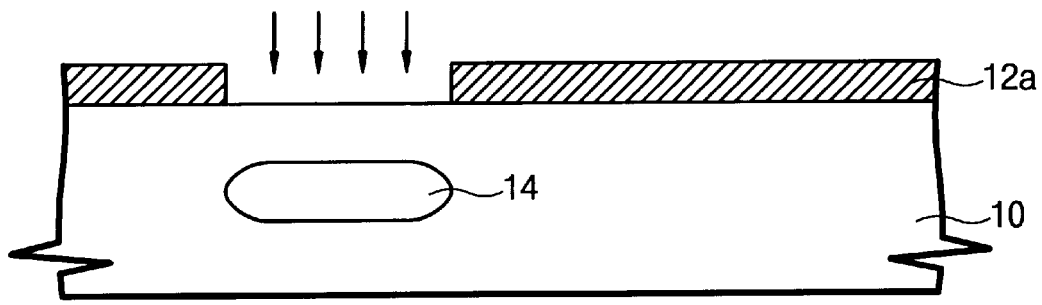
FIGS. 1A–1D are flow diagrams showing a method for forming a prior triple-well.
Figure 1B:
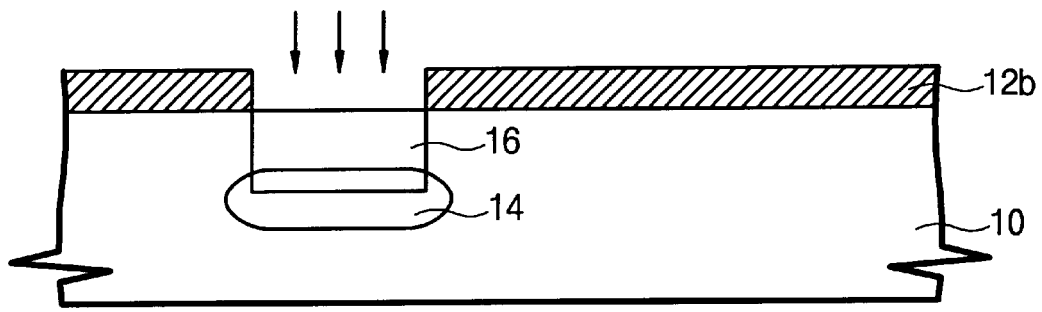
Figure 1C:
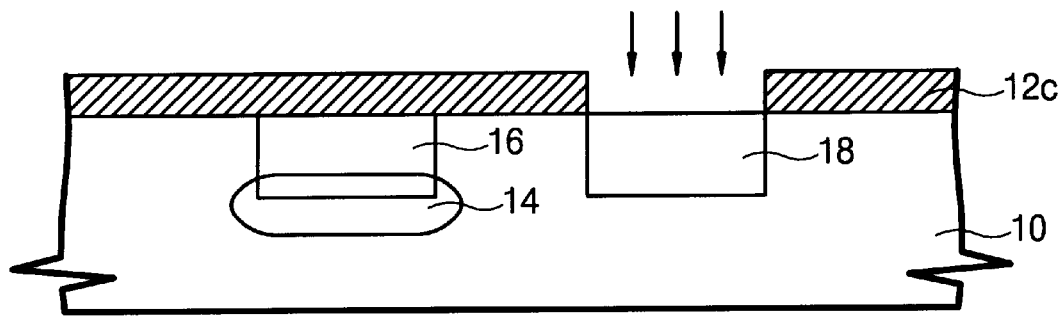
Figure 1D:
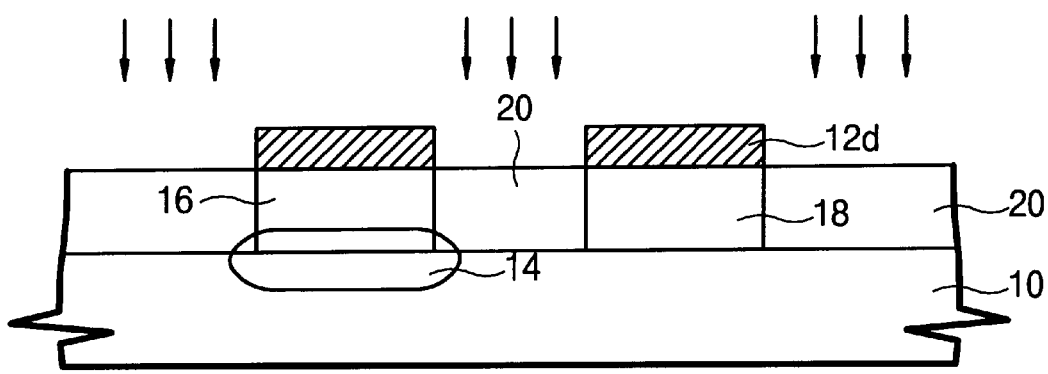
Figure 2A:
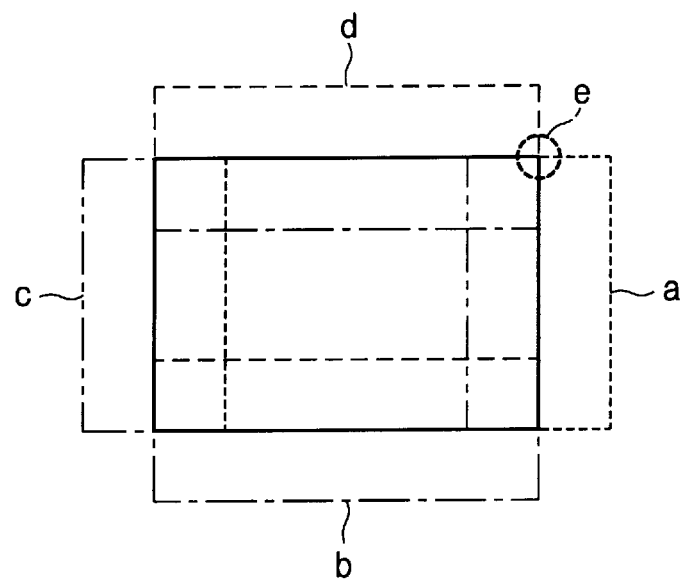
FIGS. 2A–2B are plan views showing an ion implanting region in a semiconductor substrate according to an orient angle thereof.
Figure 2B:
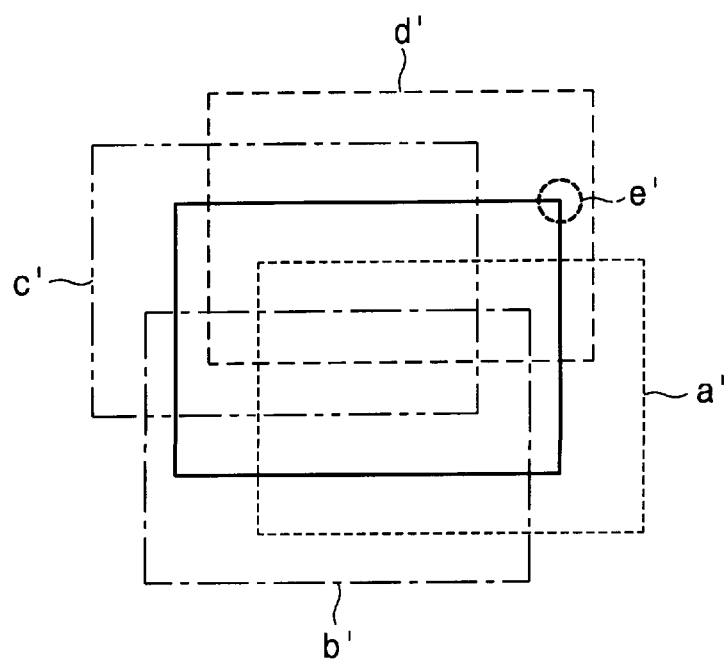

FIGS. 2A–2B illustrate an ion implanting region in a semiconductor substrate according to an orient angle thereof.

In FIG. 2A, the condition is that a tilt angle is one selected from an angle range of about 15 to 30 degrees. An initial circular angle of a plate zone is set to a standard position (that is, 0 degree) at a position where the first photoresist pattern 102a is formed. Whenever the plate zone (that is, semiconductor substrate 100) is circulated to +90, +180, and +270 degrees from the position, ion implanting regions a, b, c, and d (which is formed by implanting ion in semiconductor substrate) do not secure the overlap margin at the edge portion 'e' of FIG. 2A.

In FIG. 2B, the condition is that a tilt angle is one selected from an angle range of about 15 to 30 degrees. An initial circular angle of a plate zone is set to a standard position (that is, 0 degree) at a position where the first photoresist pattern 102a is formed. Whenever the plate zone (that is, semiconductor substrate 100) is circulated at an angle range of 30 to 70 degrees from the position and to +90, +180, and +270 degrees from the position, ion implanting process is respectively performed. In the preferred embodiment, the standard is set for a position where the semiconductor substrate 100 is circulated to 55 degrees from foregoing position where the first photoresist pattern 102a is formed. Whenever the semiconductor substrate 100 is circulated to +90, +180, and +270 from the standard position, the ion implanting process is performed. That is, whenever the semiconductor substrate 100 is circulated to +55, +145, +235, and +325 from the position where the first photoresist pattern 102a is formed, the ion implanting process is performed. Consequently, the overlap margin is fully secured on the edge portion 'e' of FIG. 2B, owing to an ion implanting region formed in the semiconductor substrate 100.

Next, an ion implanting distance is considered in the ion implanting process.

Figure 4:
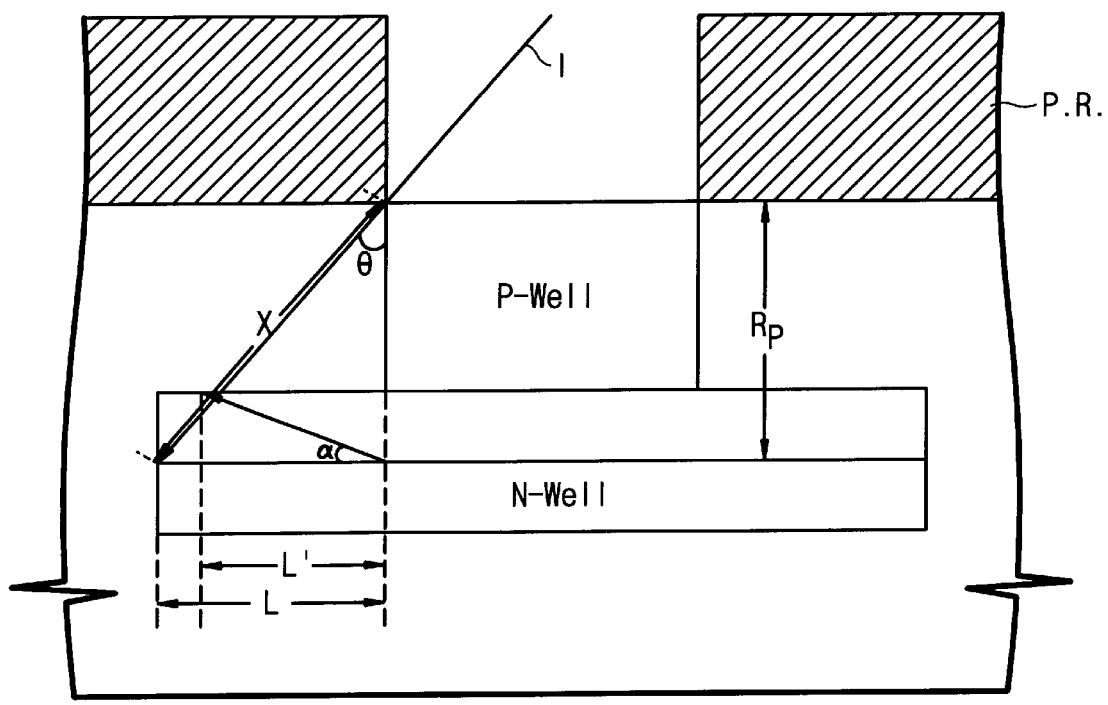
FIG. 4 is a view showing an ion implanting distance securing overlap margin according to the present invention.

FIG. 4 illustrates ion implanting distance securing the overlap margin according to the present invention.

As shown in FIG. 4, the ion implanting distance is in close connection with ion implanting energy. In case ion beam I, ion implanting vertical distance $R_P$, and the semiconductor substrate 100 have tilt angle and orient angle, ion implanting distance X, overlay distance L, efficient overlay distance L', tilt angle $\theta$, and orient angle $\alpha$ have relation to the ion implanting energy, according to the following formulas:

$X = R_P/\cos\theta$, [Formula 1]

$L' = L \times \cos\alpha$, [Formula 2]

$L = X \times \sin\theta$, [Formula 3]

$L' = X \times \sin\theta \times \cos\alpha = R_P \times \tan\theta \times \cos\alpha$ [Formula 4]

The ion implanting energy of about 1,200 KeV distributes maximum concentration impurity ion to a position which is vertical to a surface of the semiconductor substrate 100 with a depth of about 1.28 $\mu$m. That is, $R_P = 1.28$ $\mu$m.

In case overlap margin (that is, efficient overlay distance) L' is about 400 nm, ion implanting vertical distance $R_P$ is 1.28 to a surface of a semiconductor substrate, orient angle $\alpha$ of the semiconductor substrate is about 55 degree, and tilt angle $\theta$ is 29 degree, practical ion implanting distance X should be 1.46 $\mu$m. So to speak, the energy implanting impurity ion from the inside of a semiconductor substrate to a position of depth 1.46 $\mu$m is required. That is, the energy that maximum ion may reach the portion, vertical to the surface of the semiconductor substrate, of depth 1.46 $\mu$m in the semiconductor substrate is required.

Accordingly, the energy of this invention should be consumed more than the prior ion implanting energy of about 1,200 KeV. The implanting energy of about 1,500 KeV should be consumed to implant the impurity ion into a position of about 1.46 $\mu$m depth in the semiconductor substrate 100. After formation of the first well isolation region 104, a following ion implanting process is performed to form a first well 106 where a sense amplifier, a word line driver, and an input/output gate of a DRAM device are formed. A first conductive impurity ion is implanted through a conventional ion implanting method by using the first mask 102a forming the first well isolation region 104 again, so that the first well 106 is formed to be overlaid on the first well isolation region 104.

Figure 3C:
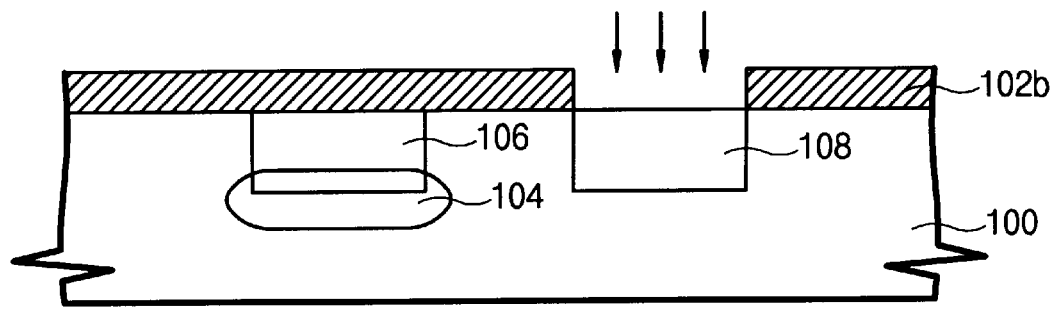

Referring to FIG. 3C, after the first mask 102a is jointly used to form the first well 106 and the first well isolation region 104, the first mask 102a is removed to form a second photoresist film on the semiconductor substrate 100. The second photoresist film is patterned through a conventional photo-etching process, so that a second photoresist pattern 102b is formed to define a region of forming a second well 108. Using the second photoresist pattern 102b as a mask, the first conductive impurity ion is implanted to form the second well 108. The second well 108 should be far from to some degree so as to be electrically isolated from the first well 106. As a following process, an N-channel MOS transistor of a peripheral circuit region of a DRAM device is formed in the second well 108.

Figure 3D:
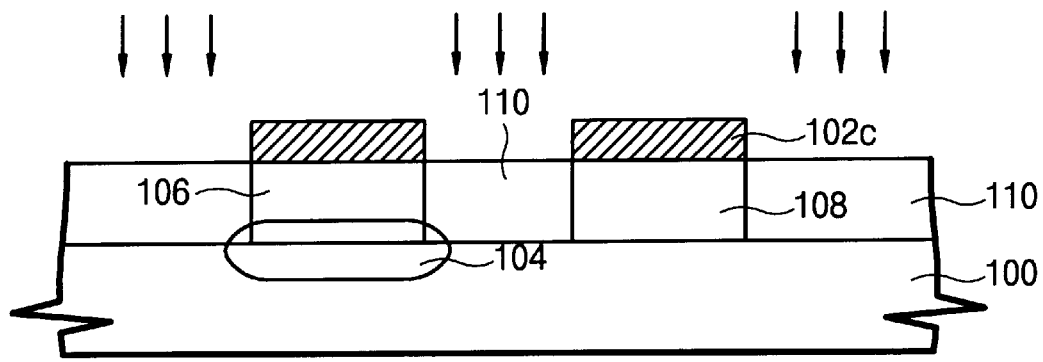

Referring to FIG. 3D, after removal of the second photoresist pattern 102b, a third photoresist film is formed on the semiconductor substrate 100. The third photoresist film is patterned to form a third photoresist pattern 102c defining a third well 110. The second conductive impurity ion is implanted by using the third photoresist pattern 102c as a mask, so that the third well 110 is formed in the semiconductor substrate 100 of both sides of the first well 106 and the second well 108. The third well 110 should surround both sidewalls of the first well 106, thereby suppressing leakage current applied to a side wall of the first well 106.

In the triple-well of this invention, a photo process forming a well isolation region used in a method for forming a prior well is excluded to simplify a method for forming a triple-well of the DRAM device and reduce time and expenditure.

What is claimed is:

1. A method of forming a semiconductor device comprising:

forming a first mask pattern for defining a first well region on a semiconductor substrate of a first conductivity type;

using said first mask pattern and large tilted-implanting impurity ions of a second conductivity type into said semiconductor substrate having a predetermined orient angle in the middle of circulation thereof to form a first well isolation region;

using said first mask pattern again and implanting impurity ions of a first conductivity type into said substrate to form a first well region as to be overlaid on a portion of said first well isolation region;

removing said first mask pattern;

forming a second mask pattern for defining a second well region on the semiconductor substrate;

using said second mask pattern and implanting impunity ions of a first conductivity type to form a second well region as to be spaced apart from said first well region;

removing said second mask pattern;

forming a third mask pattern for defining a third well region on said substrate outside of said first and second well regions; and using said third mask and implanting impurity ions of a second conductivity type to form a third well region surrounding at least both sidewalls of said first well region.

2. The method according to claim 1, wherein said tilted implanting impurity ions is carried out at a tilted angle in the range of about 15 degrees to 30 degrees.

3. The method according to claim 1, wherein said predetermined orient angle is in the range of about 30 degrees to 70 degrees.

* * * * *